(12) United States Patent
Chandwani et al.

(10) Patent No.: US 7,283,921 B2
(45) Date of Patent: Oct. 16, 2007

(54) MODELING MODULE

(75) Inventors: Neelam Chandwani, Portland, OR (US); Udayan Mukherjee, Portland, OR (US); Wen Wei, Beaverton, OR (US); Chetan Hiremath, Portland, OR (US); Rakesh Dodeja, Portland, OR (US); Kevin W. Bross, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/202,269

(22) Filed: Aug. 10, 2005

(65) Prior Publication Data

US 2007/0038407 A1 Feb. 15, 2007

(51) Int. Cl.
*G01K 1/00* (2006.01)
*G01K 3/00* (2006.01)
*G01K 5/00* (2006.01)

(52) U.S. Cl. .................. 702/130; 702/99; 374/100; 73/23.25

(58) Field of Classification Search ................. 702/130
See application file for complete search history.

(56) References Cited

U.S. PATENT DOCUMENTS 7,084,595 B2 * 8/2006 Brogardh et al. ........... 318/560

* cited by examiner

*Primary Examiner*—John Barlow
*Assistant Examiner*—Sujoy Kundu
(74) *Attorney, Agent, or Firm*—Ted A. Crawford

(57) ABSTRACT

A modeling module is disclosed that couples to a modular platform chassis. The modeling module includes a resident management controller to implement a test to model a component layout for a module to be received and coupled to the modular platform chassis. The test includes an operating thermal load for a component resident on the module at a given location. The module has a dimensional length and width that is similar to that of the modeling module. The modeling module also includes a thermal load device that is responsive to the management controller. The thermal load device is to implement at least a portion of the test by simulating the operating thermal load for the component resident on the module at the given location.

26 Claims, 5 Drawing Sheets

MODELING MODULE

BACKGROUND

Modular platform systems are typically used in communication networks where reliability is increased and cost reduced by the use of interoperable pieces. Such interoperable pieces may include modular platform shelves or chassises. These modular platform chassises include one or more backplanes that couple to other interoperable pieces such as modules and/or devices. Modules may include, but are not limited to blades, carrier boards, processing boards, mezzanine cards, interconnects, etc. Devices may include, but are not limited to fans, power equipment modules (PEM), field replaceable units (FRUs), alarm boards, sensors, rear transition modules (RTMs), etc.

Typically, modular platform systems and the interoperable pieces to be received and coupled to these systems are designed by various different product development teams both within and outside of an organization. For example, these interoperable pieces may be designed in compliance with an industry standard such as the PCI Industrial Computer Manufacturers Group (PICMG), Advanced Telecommunications Computing Architecture (ATCA) Base Specification, PICMG 3.0 Revision 1.0, published Dec. 30, 2002 (hereinafter referred to as "the ATCA specification"). Each interoperable piece may then be received and coupled to a slot and/or interface (e.g., a backplane) within another interoperable piece (e.g., a modular platform chassis). The other interoperable piece may also be designed in compliance an industry standard such as the ATCA specification.

DETAILED DESCRIPTION

Typically, modules and/or devices to be received and coupled to a modular platform chassis are tested to model power, thermal and airflow characteristics while operating within the modular platform chassis. These models may take into account the interaction of other modules and/or device that are also received and coupled to the modular platform chassis. For example, a processing blade may include a resident component (e.g., a processing element) located on the processing blade at a given location. This component may generate a large amount of thermal energy during operation within a modular platform chassis. The processing blade may be located next to other models and/or devices that also include resident components located in various locations that may also generate a large amount of thermal energy. Therefore, tests to model the processing blade's power, thermal and airflow characteristics need to account for all the possible modules and/or devices and the location of their corresponding thermal generating components.

Since interoperable modules and components may be designed by various different product design/development teams within and outside of an organization, a timely and accurate modeling is problematic. This modeling is problematic due to a multitude of possible module and component combinations from different design teams. Since all or portions of the possible modules and/or devices are typically purchased and/or acquired and then tested during operation within the modular platform chassis, this may make an accurate model costly. Additionally, whenever new modules and devices are designed, a model may become obsolete due to these new designs.

Figure 1:
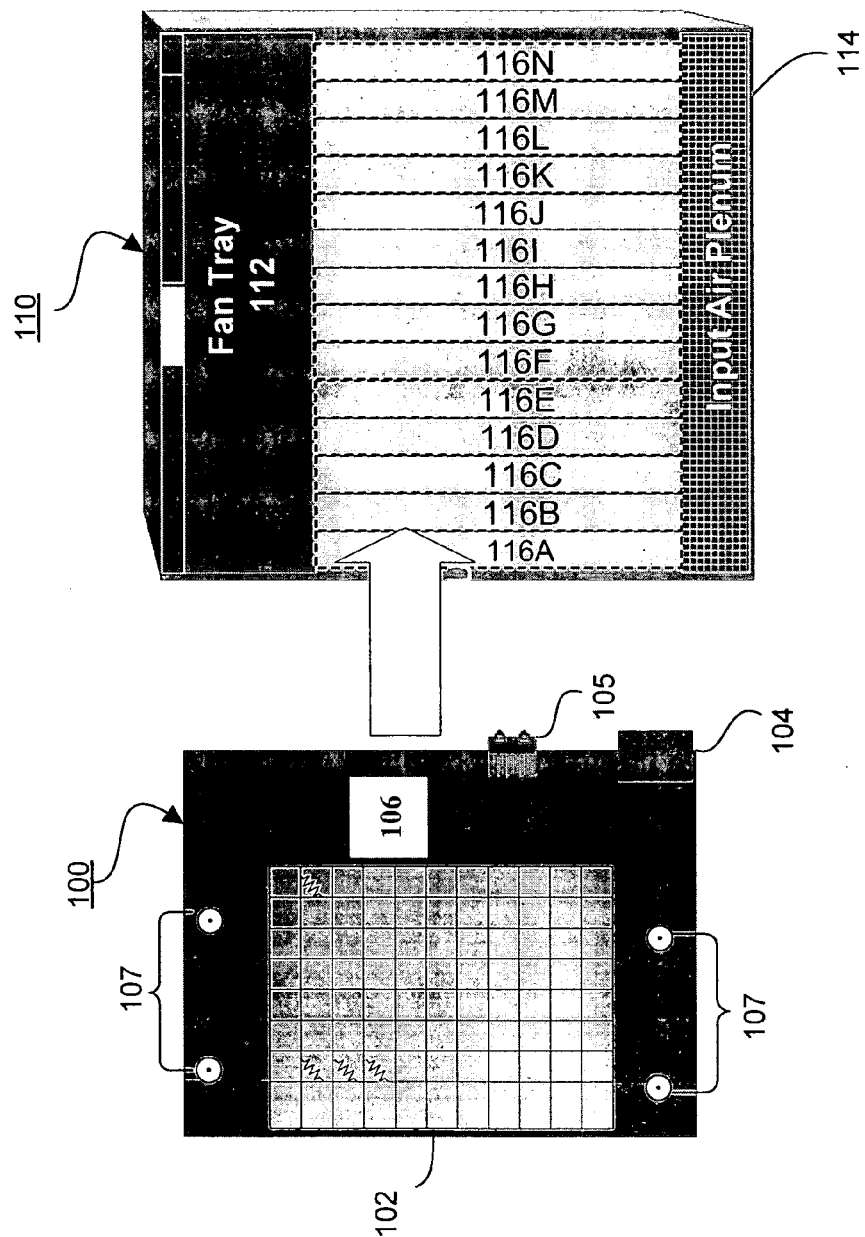
FIG. 1 is an example illustration of a modeling module to be received and coupled to a modular platform chassis.

FIG. 1 is an example illustration of a modeling module 100 to be received and coupled to a modular platform chassis 110. As depicted in FIG. 1, modeling module 100 includes a thermal load device 102, power connector 104, data transport connector 105, management controller 106 and sensors 107. Modular platform chassis 110 is also depicted as including slots 116A–N, fan tray 112 and input air plenum 114.

In one example, modeling module 100 may be received and coupled to modular platform chassis 110 via any one of slots 116A–N. Although not shown in FIG. 1, slots 116A–N may include power and data transport interfaces. These power and data transport interface may be resident on a backplane (not shown) within modular platform chassis 110 and may provide data and/or power pathways to modules or devices received and coupled to modular platform chassis 110. For example, power connector 104 and data transport connector 105 on modeling module 100 may couple to these interfaces on the backplane once modeling module 100 is received and coupled to modular platform chassis 110.

In one implementation, modules such as processing and switch blades may be received and coupled to modular platform chassis 110 via one or more slots 116A–N. In this implementation, at least one slot of slots 116A–N remains open. In this open slot, for example, modeling module 100 may be received and coupled to modular platform chassis 110. As described in more detail below, modeling module 100 may be used to implement a test to model the power, thermal and airflow characteristics of a module operating within modular platform chassis 110 with and/or without other modules also received and coupled to modular platform chassis 110.

In one implementation, as shown in FIG. 1, modeling module 100 includes management controller 106 and thermal load device 102. Management controller 106, for example, may include control logic to implement a test program to model power, thermal and airflow characteristics for a component layout associated with a module to be received and coupled to modular platform chassis 110. This model, for example, may take into account the interaction of other modules and/or device that are also received and coupled to modular platform chassis 110. Thus, a three-dimensional image or model of the component layout associated with the module may be mapped out to determine prevailing temperatures, hotspots, power dissipation and airflow profiles. At least a portion of the other modules may be operating and/or not operating while the test is implemented.

In one example, thermal load device 102 may be responsive to management controller 106 to implement at least a portion of the test. Thus, in response to management controller 106, thermal load device 102 may recreate or simulate the thermal load exhibited by a component on a module while the module is operating within modular platform chassis 110. As described below for FIG. 2, in one example, thermal load device 102 may simulate the location of the component by providing power to a portion of thermal load device 102 (e.g., a resistor) that corresponds to the location of the component. Additionally, thermal load device 102 may contain slots to receive and couple to a structure which may simulate or mimic the profile and thermodynamic characteristics of the component.

As another part of the test implementation, sensors 107, also responsive to management controller 106, may monitor the power consumed and air flowing through and over modeling module 100 during the time thermal load device 102 is simulating the thermal load exhibited by the component. Sensors 107 may also include temperature sensors to monitor the temperature of the air flowing over a structure and/or a component resident on or coupled to modeling module 100 during the test implementation. In one example, sensors 107 to monitor power consumed may include voltage and current sensors to also monitor the structures and/or components resident on or coupled to modeling module 100 during the test implementation.

In one example, modeling module 100 may have the same or similar dimensions as the module whose component layout is being modeled. Dimensions, for example, such as length and width. Thus, for example, when modeling module 100 is received and coupled to modular platform chassis 110 it has the same profile as the module would have while received and coupled to modular platform chassis 110.

In one example, management controller 106 may couple to and/or include one or more input/output (I/O) interfaces which may enable communication with modular platform chassis 110 system management devices, other interconnects in modular platform chassis 110 or electronic systems located remotely to modular platform chassis 110 (e.g., via data transport connector 105). Management controller 106, for example, may receive a series of instructions from application software external to modeling module 100 via these I/O interfaces. The series of instructions, for example, may invoke management controller 106 to implement a test to model power, thermal and airflow characteristics.

In one implementation, management controller 106 may also include one or more applications in a memory accessible to and/or included within management controller 106. These applications, for example, may provide instructions to implement a test. Additionally, these applications may provide instructions to generate a user interface, e.g., a graphical user interface (GUI), to enable a user to communicate with management controller 106 to modify test conditions before, during and after a test is implemented within modular platform chassis 110.

In one example, results of the test may be captured by management controller 106 (e.g., in a memory) and/or relayed to other controllers within modular platform chassis 110. Thus an updated model may be generated, created, modified and/or adjusted each time a test is implemented within modular platform chassis 110.

Figure 2:
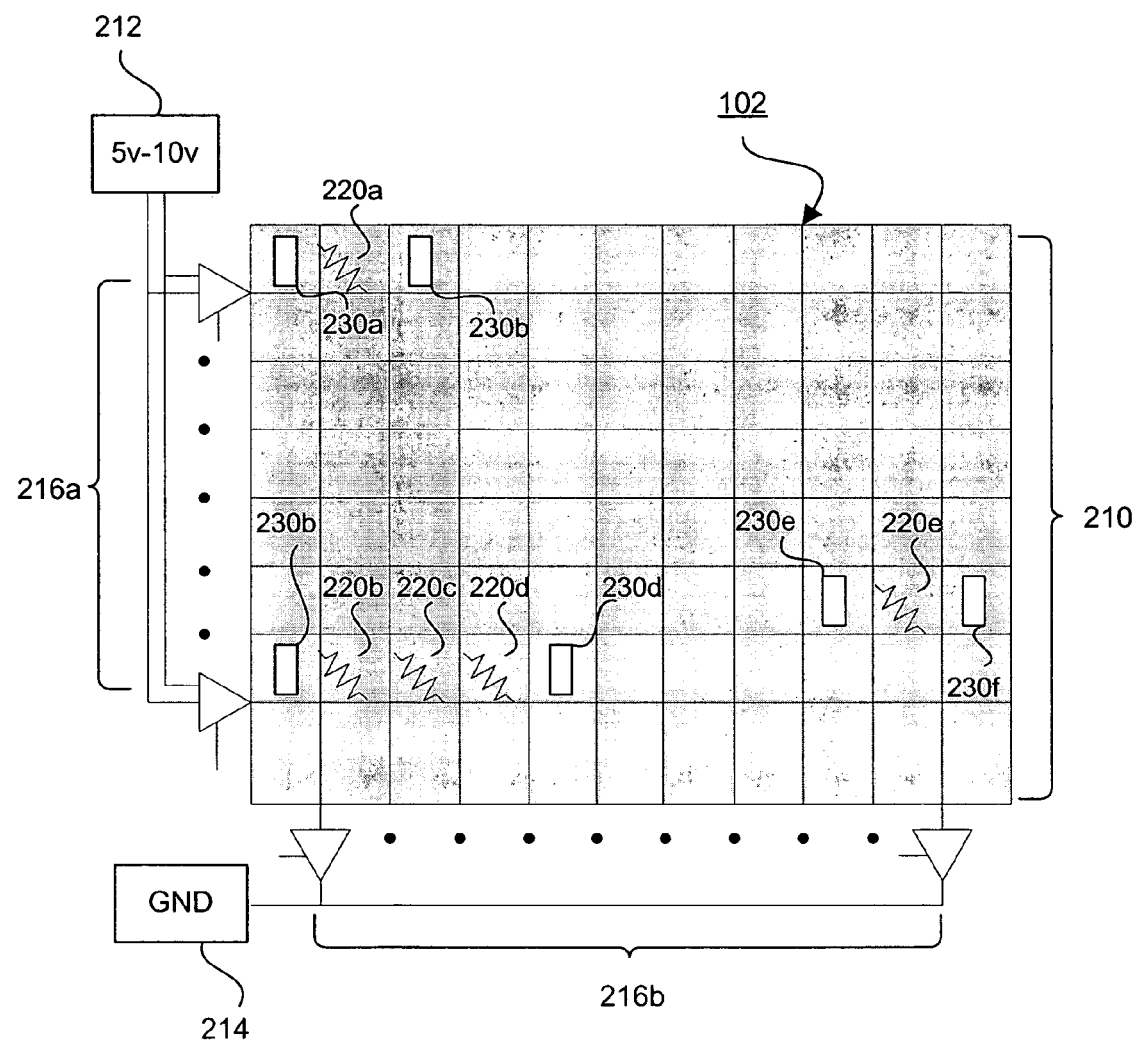
FIG. 2 is an example illustration of a thermal load device.

FIG. 2 is an example illustration of thermal load device 102. As shown in FIG. 2, thermal load device 102 includes power feed grid 210. In one example, power feed grid 210 includes power feeds that couple to power source 212 and to ground 214. Also shown in FIG. 2, are resistors 220*a–e* that are located on thermal load device 102 such that one end of resistor 220*a–e* couples to a power feed coupled to power source 212 and the other end couples to a power feed coupled to ground 214. A programmable switch 216*a–b* is also depicted in FIG. 2, for example, to control the amount of power provided to one or more power feeds of power feed grid 210.

In one example, thermal load device 102 also includes one or more slots (e.g., slots 230*a–f*). As introduced above, these slots may receive and couple to structures (not shown) that may mimic and/or simulate the physical profile and thermodynamic characteristics of a component on a module. Slots 230*a–f*, for example, may be located on thermal load device 102 such that a structure may be placed proximate to one or more resistors 220*a–e*. For example, FIG. 2 shows slots 230*a–b* near resistor 220*a* and slots 230*c–d* near resistors 220*b–c*. Additional slots may also be located on thermal device 102 to receive and couple to sensors to monitor the different operating environmental conditions while a test is implemented. For example, power, air and structure temperatures and airflow may be monitored by these sensors.

In one example, FIG. 2 depicts resistors 220*a–e* in specific locations on thermal load device 102. However, more or less resistors may be placed in locations on thermal load device 102. A resistor, for example, may be removable and thus can be placed at various locations on the power feed grid of thermal load device 102. In another example, resistors 220*a–e* may be at fixed locations on thermal load device 102. Additionally, the number of resistors at a location is not limited to only one resistor but may include one or more resistors connected to thermal load device serially, in parallel or a combination of serial and parallel.

In one example, power source 212 and ground 214 may couple to power and ground traces or feeds resident on modeling module 100. Power, for example, may be provide through a backplane within modular platform chassis 110 via power connector 104 on modeling module 100. A power converter (not shown) may be resident on modeling module 100 to provide a greater amount of power granularity than that provided by the backplane. In addition to and/or alternatively, thermal load device 102 may include a power converter to further increase the power granularity provided by modeling module 100.

In one example, in response to management controller 106, thermal load device 102 may implement at least a portion of a test to model a component layout for a module to be received and coupled to a modular platform chassis. This portion of the test may include simulating the operating thermal load(s) for one or more components resident on the module at one or more given locations. Thus, thermal load device 102 may simulate the operating thermal load by invoking or programming programmable switch 216*a–b* to route power to a resistor 220*a–e* to simulate the operating thermal load of the component. For example, programmable switch 216*a–b* may simulate power levels associated with given thermal loads by providing power (opening a circuit) on a power feed coupling power source 212 and ground 214. The particular power feed, for example, may correspond with a resistor located at a location within power feed grid 210. The resistor, for example, may correspond with the given location of the component whose thermal load is being simulated. The amount of power may also be varied to reflect a range of possible thermal loads to more accurately model a component(s) as it operates.

In one example, a test to model a component layout for a component located on a module at a location corresponding to resistor 220*a* is to be implemented by management controller 106. In this test, the component has an example operating thermal load corresponding to 40 watts of power. Resister 220*a*, for example, has a resistance of 10 ohms (either fixed or variable). Thus to implement the test, in response to management controller 106, thermal load device 102 programs programmable switches 216*a* and 216*b* to create a circuit between power source 212 and ground 214 on power grid feeds 210 to provide 2 Amps of current to resistor 220a. Thus, for example, as the 2 Amps of current flows through the 10 ohm resistor 220a, 40 watts of power is dissipated by the resister to simulate the thermal load of the component being modeled.

Figure 3:
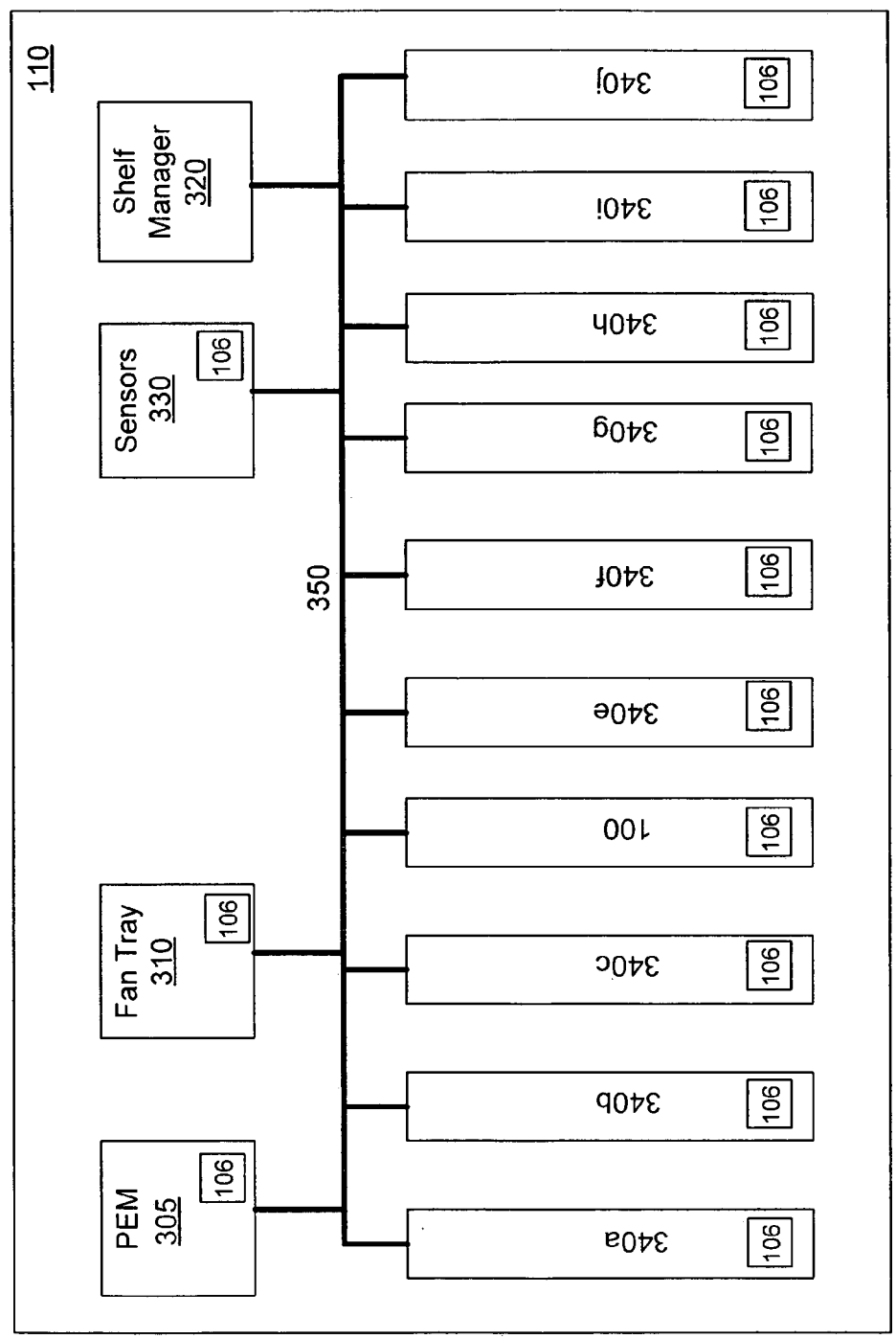
FIG. 3 illustrates an example block diagram architecture for the coupling of modules and devices within the modular platform chassis.

FIG. 3 illustrates an example block diagram architecture for the coupling of modules and devices within modular platform chassis 110. The example block diagram depicted in FIG. 3, includes modeling module 100 coupled to a management bus 350. Also shown as coupled to management bus 350 are PEM 305, Fan tray 310, shelf manager 320, sensors 330, modules 340a–b and modules 340e–j.

In one implementation, shelf manager 320 may serve as system management device for modular platform chassis 110. Shelf manager 320, for example, may communicate with other modules (e.g., modeling module 100) and devices (e.g., PEM 305) via management bus 350 to manage and/or control these devices once received and coupled to modular platform chassis 110 in slots 116A–N Management bus 350, for example, may be within a backplane within modular platform chassis 110. Thus, for example, when modeling module 100 couples to an interface on the backplane (e.g., via data transport connector 105), modeling module 100 may couple to management bus 350.

In one example, to facilitate communication with shelf manager 320, each module and/or each device may include a management controller 106. Management controller 106, for example, may include an I/O interface to enable communication with shelf manager 320 via management bus 350.

In one example, PEM 305 may provide power to the modules and/or devices coupled to modular platform chassis 110. Fan tray 310, for example may include one or more fans to provide cooling via air circulation. Sensors 330, for example, may include, but are not limited to, temperature, power and airflow sensors to monitor the operating environment for all or portions of modular platform chassis 110. In one example, PEM 305, fan tray 310 and sensors 330 may each include a management controller 106. As mentioned above, management controller 106 may couple to management bus 350 and shelf manager 320 may forward management/control instructions via management bus 350 to management controllers 106 resident on these devices. Thus, for example, shelf manager 320 may manage/control devices coupled to modular platform chassis 110 by communicating to each device's management controller 106 via management bus 350.

In one example, modular platform chassis 110 may operates in compliance with the ATCA specification. In this regard, management bus 350 may be an Intelligent Platform Management Bus (IPMB). An ATCA IPMB complies and/or is compatible with the "Intelligent Platform Management Bus Communications Protocol Specification," Document Revision 1.0, published Nov. 15, 1999, and/or later versions of the standard (the "IPMB standard"). Additionally, an example communication protocol that may be used when communicating via an IPMB is described in the Intelligent Platform Management Interface (IPMI) Standard detailed in "Intelligent Platform Management Interface Specification Second Generation," Document Revision 1.0, dated Feb. 12, 2004, published by Intel, Hewlett-Packard, NEC, and Dell, and/or later versions of the standard (the "IPMI standard").

In one example, modules and/or devices coupled to modular platform chassis 110 may also operate in compliance with the ATCA specification. In this example, management controller 106 may be an Intelligent Platform Management Controller (IPMC) and the I/O interface for management controller 106 may use the IPMI standard to communicate with shelf manager 320 via an IPMB compliant management bus 350.

Figure 4:
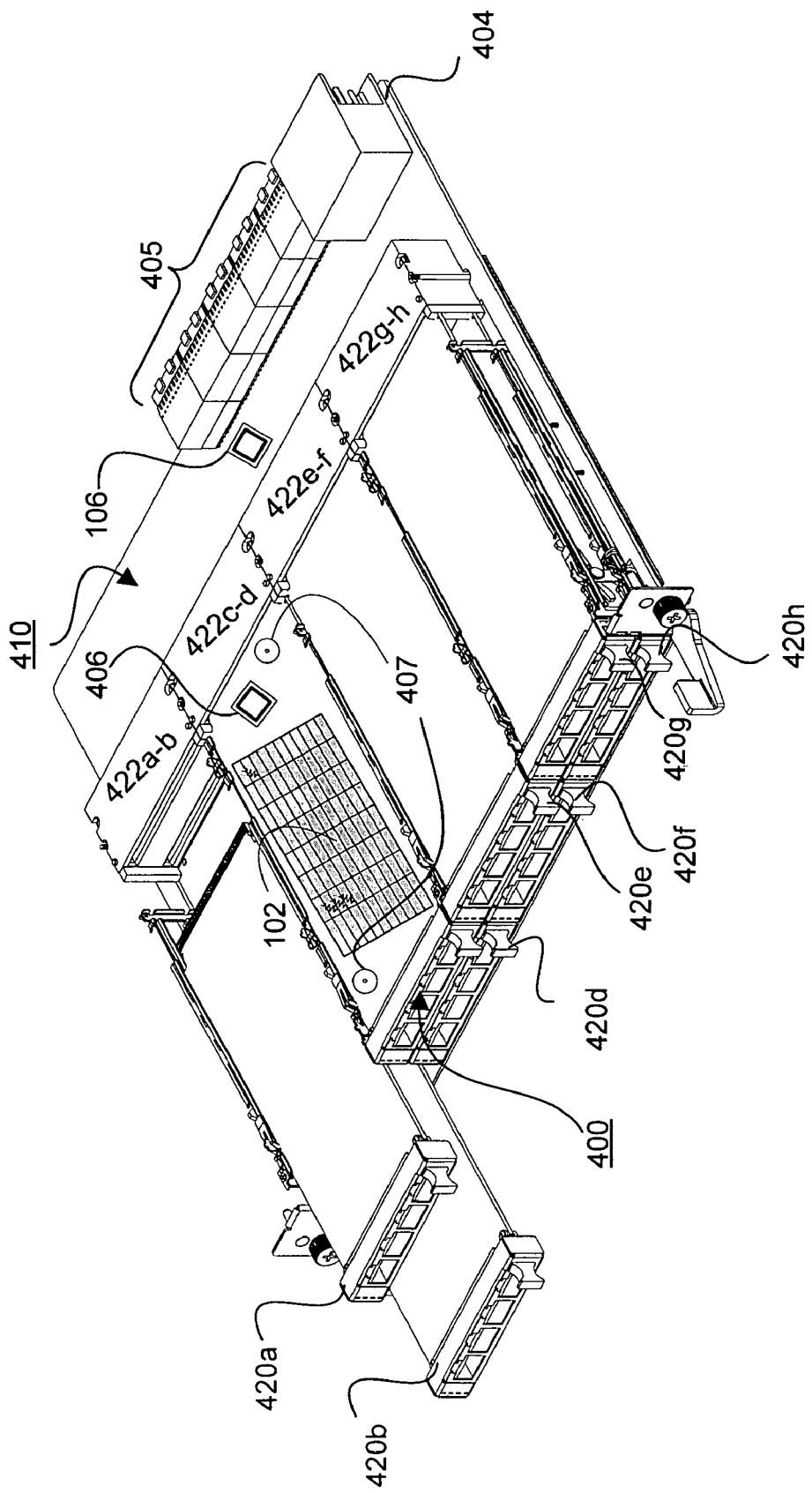
FIG. 4 is an isometric view of a modeling module to be received and coupled to a carrier board.

FIG. 4 is an isometric view of a modeling module 400 to be received and coupled to a carrier board 410. Carrier board 410 is shown in FIG. 4 as being able to receive and couple to eight modules or mezzanine cards. In FIG. 4, mezzanine cards 420a–b are to be received and coupled to interfaces 422a and 422b, and mezzanine cards 420d–h are received and coupled to interfaces 422d–h. In one example, modeling module 400 is received and coupled to carrier board 410 via interface 422c. Although this disclosure is not limited to the particular number of mezzanine cards and/or the number of interfaces depicted in FIG. 4.

In one implementation, carrier board 410 is to be received and coupled to modular platform chassis 110. Thus, for example, carrier board 410 includes a power connector 404 and data transport connectors 405 to provide power and data pathways between carrier board 410 and modular platform chassis 110. Carrier board 410 may also include a management controller 106. This management controller 106, as described in FIG. 2 and FIG. 3, may include an I/O interface to enable communication with shelf manager 320 via management bus 350.

As shown in FIG. 4, modeling module 400 includes a thermal load device 102, a resident module management controller 406 and sensors 107. In one example, module management controller 406 functions in a similar manner as to that described above for module management controller 106. Thus, in one implementation, module management controller may include control logic to implement a test to model a component layout for a module (e.g., a mezzanine card) to be received and coupled to carrier board 410. The test, for example, may include an operating thermal load for a component resident on a mezzanine card at a given location.

In one example, thermal load device 102 functions as described in FIG. 2 and may be responsive to module management controller 406 to implement at least a portion of the test. Thus, in response to module management controller 406, thermal load device 102 may simulate the thermal load exhibited by a component on a mezzanine card. The simulation, for example, to recreate the thermal load while the component is operating on the mezzanine card. The simulation may occur while modeling module 400 is coupled to carrier board 410 and carrier board 410 is coupled to modular platform chassis 110.

As described in FIG. 2 above, in one example, thermal load device 102 may also simulate the location of the component that corresponds to the location of the component on the mezzanine card. Additionally, thermal load device 102 may contain slots to receive and couple to a structure. This structure, for example, may mimic the profile and thermodynamic characteristics of the component. In one example, the structure may contain the same metallurgical, plastic and/or fiber composition as the component being modeled as well as any heat sinks associated with the component.

As another part of the test implementation, sensors 107, also responsive to module management controller 406, may monitor the power and air flowing through and over modeling module 400 during the time thermal load device 102 is simulating the thermal load exhibited by the component. Sensors 107 may also monitor the temperature of the air flowing over a structure and/or a component resident on or coupled to modeling module 400 during the test implementation.

In one example, similar to modeling module 100, modeling module 400 may have the same or similar dimensional length and width as the mezzanine card whose component layout is being modeled. Thus, for example, when modeling module 400 is received and coupled to carrier board 410 it has the same profile as a mezzanine card would have while received and coupled to carrier board 410.

In one implementation, carrier board 410 may operate in compliance with the ATCA specification and another industry standard known as the Advanced Mezzanine Card (AMC) Specification, PICMG AMC.0, Revision 1.0, published Jan. 3, 2005 (hereinafter referred to as "the AMC.0 specification"). Thus, for example, management controller 106 may be an IPMC as described in both the ATCA and the AMC specification. In addition, modeling module 400 may operate in compliance with the AMC specification. In this regard, module management controller 406 may be a module management controller (MMC) as described in the AMC specification.

In one example of this ATCA/AMC implementation, management controller 106, may forward management/control instructions to module management controller 406 via a management bus (not shown) described in the AMC specification as a Local IPMB or IPMB-L bus. As described above in FIG. 3, management controller 106, for example, may couple to management bus 350 to receive management/control instructions from shelf manager 320. This management bus 350, as described above, may be an ATCA IPMB and is described in the AMC specification as IPMB-0. Thus in this example, shelf manager 320 may forward management/control instructions destined for module management controller 406 to management controller 106 on carrier board 410 via IPMB-0 and management controller 106 may then forward these instructions to module management controller 406 via the IPMB-L. These instructions, for example, may be forwarded using IPMI standard communication protocols.

Figure 5:
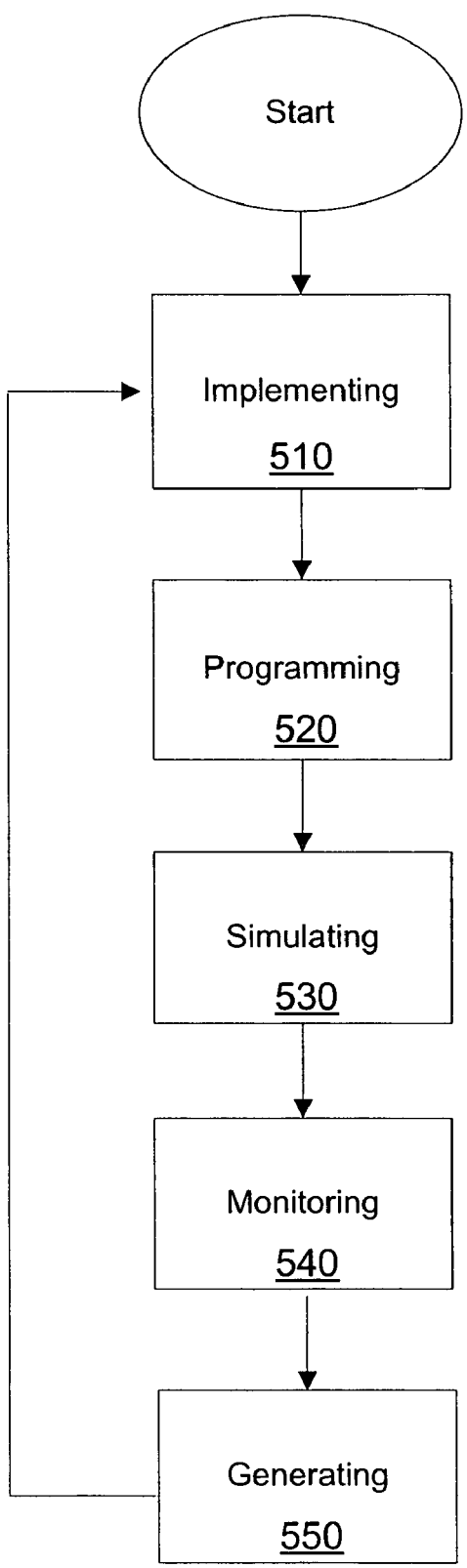
FIG. 5 is a flow chart of an example method to implement a test to model a component layout while a modeling module is received and coupled to the modular platform chassis.

FIG. 5 is a flow chart of an example method to implement a test to model a component layout while modeling module 100 is received and coupled to modular platform chassis 110. In this example method, modular platform chassis 110 may operate and/or is designed to operate in compliance with the ATCA specification. However, this disclosure is not limited to only to ATCA compliant modular platform chassises but may also apply to modular platform chassises operating in compliance with the Compact Peripheral Component Interface (cPCI), VersaModular Eurocard (VME), or other types of industry standards governing the design and operation of modular platform chassises. In addition, this disclosure may also apply to proprietary modular platform chassises designed to operate in a modular platform system.

This example method describes a single modeling module 100 implementing a test to model a component layout. However, this disclosure is not limited to a single modeling module 100 implementing a test within a modular platform chassis. In one example, a plurality of modeling modules may concurrently implement tests within a modular platform chassis to generate an operating model for one or more component layouts for one or more models.

In block 510, according to one example, a test is implemented to model a component layout for a module to be received and coupled to a modular platform chassis. The test, for example, may include an operating thermal load for a component resident on the module at a given location. For example, the operating thermal load for a component resident on board to be received and coupled to modular platform chassis 110. The component may be a processing element, the processing element may include but is not limited to, a network processor, digital signal processors (DSP), microprocessors, microcontrollers, a graphics processor, a chipset, field programmable gate arrays (FPGA), or application specific integrated chips (ASIC).

In one example, to test the operating thermal load, the amount of power dissipated by the operating thermal load is equivalent to the power usage of the processing element. This power usage, for example, is determined by referencing the power usage specifications provided by the manufacturer of the processing element. This power usage may vary during one or more stages of operation. Such stages of operation may include, but are not limited to, start-up, idle, full power, stand-by and power-down stages. This power usage may be measured in watts.

In addition to testing the thermal load, the physical and thermodynamic traits of the component may also be tested. In one example, these thermodynamic traits are referred to as the cooling efficiency of the component. In one implementation, improvements in cooling efficiency may be tested to ensure generated heat is dissipated at a faster rate. This testing of cooling efficiency may be accomplished by placing a structure on thermal load device 102 that mimics or simulates the physical profile and thermodynamic characteristics of the component being tested. This structure may offer an increased surface area to air flowing over the structure that may improve cooling efficiency. In one example, at least a portion of the structure is referred to as a heat sink.

In one example, test criteria to implement the test to model the thermal load and/or the physical and thermodynamic traits of the component are provided to management controller 106 on modeling module 100. For example, the test criteria are provided to a memory accessible to management controller 106. An application included in management controller 106 may then access the memory to implement a test of the component. The test may be implemented once modeling module 100 is inserted into modular platform chassis 110. Alternatively, as described above, management controller 106 may include applications to provide instructions to generate a user interface, e.g., GUI. The GUI may enable a user to communicate with management controller 106 to provide the test criteria to implement the test. In yet another example, the test criteria are provided to management controller 106 from shelf manager 320. The test criteria may be provided via management bus 350 once modeling module 100 is coupled to modular platform chassis 110.

In block 520, management controller 106 may invoke thermal load device 102 to simulate the operating thermal load. The thermal load, for example, as determined in block 510. As described above in FIG. 2, thermal load device 102 in response to management controller 106 may program programmable switch 216a–b to control the amount of power provided to one or more power feeds of power feed grid 210. The power may be provided in a way that matches the operating power usage of the component (e.g., during start-up, idle, full power and power-down). Also as described above, resistors and structures resident on and/or inserted on thermal load device 102 at locations corresponding to the location of the component may simulate and/or mimic the operating thermal load, profile, and thermodynamic traits of the component.

In block 530, programmable switch 216a–b provides power to one or more power feeds of power feed grid 210 based on the program to simulate the operating thermal load. This simulation may occur while modeling module 100 is received and coupled to modular platform chassis 110. The simulation may also occur while other modules (e.g., modules 340a–c and modules 340e–j) and/or devices (e.g., PEM 305) are operating within modular platform chassis 110.

In block 540, in one example, during the simulation, in response to management controller 106, sensors 107 monitor the power and air flowing through and over modeling module 100. Sensors 107 may also monitor the temperature of the air flowing over a structure and/or a component resident on or coupled to modeling module 100.

In one example, sensors 330 as described in FIG. 3, also provide monitoring during the simulation by thermal load device 102. This monitoring may include, but is not limited to, temperature, power and airflow monitoring of the operating environment for all or portions of modular platform chassis 110 during the simulation.

In block 550, in one example, an operating model based on the simulation is generated. In one example, portions of or all of the monitored results by sensors 107 and/or sensors 330 are used to generate the operating model for the component.

In one example the process starts again at block 510 for implementing another test to model a different component layout for the same or different module. Another test may also be implemented to model different operating conditions for a given component layout.

Referring again to the illustration of modeling module 100 in FIG. 1 and modeling module 400 in FIG. 4. According to one example, management controller 106 and/or module management controller 406 may be implemented in hardware, software, firmware, or any combination thereof. In this regard, management controller 106 and/or module management controller 406 may be implemented as one or more of an ASIC, special function controller or processor, FPGA, other hardware device and firmware or software to perform at least the functions described in this disclosure.

In one implementation, the control logic contained within management controller 106 and/or module management controller 406 to implement a test to model a component lay is intended to represent any of a wide variety of logic device(s) and/or executable content to implement the test. In one example, the control logic contained within management controller 106 and/or module management controller 406 may include, but is not limited to, a microprocessor, a network processor, a microcontroller, an FPGA, an ASIC, executable content to implement the test and/or any combination of these control logic examples.

In one example, the memory described as being included in or accessible to management controller 106 and/or module management controller 406 may include a wide variety of memory media including but not limited to volatile memory, non-volatile memory, flash, programmable variables or states, random access memory (RAM), read-only memory (ROM), flash, or other static or dynamic storage media.

In one example, machine-readable instructions can be provided to management controller 106 and/or module management controller 406 from a form of machine-accessible medium. A machine-accessible medium may represent any mechanism that provides (i.e., stores and/or transmits) information in a form readable by a machine. For example, a machine-accessible medium may include: ROM; RAM; magnetic disk storage media; optical storage media; flash memory devices; electrical, optical, acoustical or other form of propagated signals (e.g., carrier waves, infrared signals, digital signals); and the like.

In the previous descriptions, for the purpose of explanation, numerous specific details were set forth in order to provide an understanding of this disclosure. It will be apparent that the disclosure can be practiced without these specific details. In other instances, structures and devices were shown in block diagram form in order to avoid obscuring the disclosure.

References made in the specification to the term "responsive to" are not limited to responsiveness to only a particular feature and/or structure. A feature may also be "responsive to" another feature and/or structure and also be located within that feature and/or structure. Additionally, the term "responsive to" may also be synonymous with other terms such as "communicatively coupled to" or "operatively coupled to," although the term is not limited in his regard.

What is claimed is:

1. A method comprising:
   implementing a test to model a component layout for a module to be received and coupled to a modular platform chassis, the test to include an operating thermal load for a component resident on the module at a given location;
   programming a thermal load device to simulate the operating thermal load, the thermal load device resident on a modeling module, wherein the modeling module comprises a similar dimensional length and width as the module and the simulation occurs on the modeling module at a location corresponding to the given location of the component resident on the module;
   simulating the operating thermal load while the modeling module is received and coupled to the modular platform chassis;
   generating an operating model for the component layout based on the simulation; and
   storing the operating model in a memory responsive to a management controller resident on the modeling module.

2. A method according to claim 1, further comprising:
   monitoring air within the modular platform chassis during the simulation, the monitoring to include air flow and air temperature as the air moves over the modeling module; and
   using at least a portion of the monitored air results to generate the operating model.

3. A method according to claim 2, wherein the air is monitored with airflow and temperature sensors resident on the modeling module.

4. A method according to claim 2, further comprising:
   modeling physical and thermodynamic traits of the component resident on the module at a given location;
   placing a structure on the modeling module to simulate the physical and thermodynamic traits of the component, the structure placed proximate to the location of the programmable thermal load;
   monitoring temperature and airflow at the structure during the simulation; and
   using at least a portion of the monitored temperature and airflow results to generate the operating model.

5. A method according to claim 4, wherein the operating model includes a mapping of a temperature and airflow profile of the component layout for the module.

6. A method according to claim 1, wherein the module and the modular platform chassis operate in compliance with an industry standard, the industry standard to include Advanced Telecommunications Computing Architecture (ATCA) Base Specification, PCI Industrial Computer Manufacturers Group (PICMG) 3.0, Revision 1.0.

7. A modeling module to couple to a modular platform chassis comprising:
a management controller resident on the modeling module to implement a test to model a component layout for a module to be received and coupled to the modular platform chassis, the test to include an operating thermal load for a component resident on the module at a given location, the module of a similar dimensional length and width to the modeling module; and
a thermal load device responsive to the management controller to implement at least a portion of the test by simulating the operating thermal load for the component resident on the module at the given location, wherein the management controller generates an operating model based on the thermal load device's simulation and stores the operating model in a memory responsive to the management controller.

8. A modeling module according to claim 7, wherein the thermal load device includes a slot to receive a structure on the modeling module, the structure to mimic the physical and thermodynamic traits of the component, the structure to be received at a location proximate to the location corresponding to the given location of the component resident on the module.

9. A modeling module according to claim 7, wherein the thermal load device includes a resistor coupled to a power feed and in response to the management controller the thermal load device routes power to the resistor to simulate the thermal load.

10. A modeling module according to claim 7, further comprising:
a temperature sensor responsive to the management controller to monitor air temperature;
an airflow sensor responsive to the management controller to monitor air flow; and
a power sensor responsive to the management controller to monitor power routed to the resistor in the thermal load device, wherein air temperature, air flow and power are monitored during the implementation of at least a portion of the test.

11. A modeling module according to claim 10, wherein the operating model based on the thermal load device's simulation comprises the operating model to include a mapping of a temperature, power dissipation and airflow profile of the component layout for the module.

12. A modeling module according to claim 7, wherein the modeling module and the modular platform chassis operate in compliance with an industry standard, the industry standard to include Advanced Telecommunications Computing Architecture (ATCA) Base Specification, PCI Industrial Computer Manufacturers Group (PICMG) 3.0, Revision 1.0 and the management controller comprises an Intelligent Platform Management Controller (IPMC) responsive to a shelf manager for the modular platform chassis.

13. A modeling module according to claim 12, wherein the shelf manager couples to a user interface to change the test to be implemented by the IPMC resident on the modeling module.

14. A modeling module according to claim 7, wherein the modeling module is resident on a mezzanine card to be received and coupled to a carrier board.

15. A modeling module according to claim 14, wherein the mezzanine card and the carrier board operate in compliance with a first industry standard, the first industry standard to include Advanced Mezzanine Card (AMC) Specification, PCI Industrial Computer Manufacturers Group (PICMG), AMC.0, Revision 1.0 and the carrier board operates in compliance with a second industry standard, the second industry standard to include Advanced Telecommunications Computing Architecture (ATCA) Base Specification, PICMG 3.0, Revision 1.0, the management controller comprises a Module Management Controller (MMC) responsive to an Intelligent Platform Management Controller (IPMC) resident on the carrier board, the modular platform chassis also operates in compliance with the second industry standard and the IPMC resident on the carrier board is responsive a shelf manager for the modular platform chassis.

16. A system comprising:
a backplane for a modular platform chassis; and
a modeling module to couple to the backplane, the modeling module to include:
a management controller to implement a test to model a component layout for a module to be received and coupled to the backplane, the model to include an operating thermal load for a component resident on the module at a given location, the module of a similar dimensional length and width to the modeling module; and
a thermal load device responsive to the management controller to implement at least a portion of the test by simulating the operating thermal load for the component resident on the module at the given location while the modeling module is received and coupled to the backplane.

17. A system according to claim 16, further comprising:
a temperature sensor responsive to the management controller to monitor air temperature;
an airflow sensor responsive to the management controller to monitor air flow; and
a power sensor responsive to the management controller to monitor power routed to the resistor in the thermal load device, wherein air temperature, air flow and power are monitored during the implementation of at least a portion of the test.

18. A system according to claim 17, wherein the test to model a component layout comprises the test to generate a model that includes a mapping of a temperature, power dissipation and airflow profile of the component layout for the module.

19. A system according to claim 16, wherein the backplane and modeling module operate in compliance with an industry standard, the industry standard to include Advanced Telecommunications Computing Architecture (ATCA) Base Specification, PCI Industrial Computer Manufacturers Group (PICMG) 3.0, Revision 1.0.

20. A system according to claim 18, wherein the modeling module comprises a mezzanine card to be received and coupled to a carrier board, the carrier board to couple to the backplane.

21. A system according to claim 20, the mezzanine card and the carrier board operate in compliance with a first industry standard, the first industry standard to include Advanced Mezzanine Card (AMC) Specification, PCI Industrial Computer Manufacturers Group (PICMG), AMC.0, Revision 1.0 and the carrier board operates in compliance with a second industry standard, the second industry standard to include Advanced Telecommunications Computing Architecture (ATCA) Base Specification, PICMG 3.0, Revision 1.0, the management controller comprises a Module Management Controller (MMC) responsive to an Intelligent Platform Management Controller (IPMC) resident on the carrier board, the backplane also operates in compliance with the second industry standard and the IPMC resident on the carrier board is responsive to a shelf manager for the modular platform chassis via an intelligent platform management bus (IPMB) within the backplane.

22. A machine-accessible medium comprising content, which, when executed by a machine causes the machine to:
  implement a test to model a component layout for a module to be received and coupled to a modular platform chassis, the test to include an operating thermal load for a component resident on the module at a given location;
  program a thermal load device to simulate the operating thermal load, the thermal load device resident on a modeling module, wherein the modeling module comprises a similar dimensional length and width as the module and the simulation occurs on the modeling module at a location corresponding to the given location of the component resident on the module;
  simulate the operating thermal load while the modeling module is received and coupled to the modular platform chassis; and
  generate an operating model for the component layout based on the simulation; and
  store the operating model in a memory responsive to a management controller resident on the modeling module.

23. A machine-accessible medium according to claim 22, further comprising:
  monitor the air within the modular platform chassis during the simulation, the monitoring to include air flow and air temperature as the air moves over the modeling module; and
  use at least a portion of the monitored air results to generate the operating model.

24. A machine-accessible medium according to claim 23, wherein the air is monitored with airflow and temperature sensors resident on the modeling module.

25. A machine-accessible medium according to claim 22, further comprising:
  model physical and thermodynamic traits of the component resident on the module at a given location;
  monitor temperature and airflow at a structure during the simulation, the structure placed proximate to the location of the programmable thermal load; and
  use at least a portion of the monitored temperature and airflow results to generate the operating model.

26. A method according to claim 22, wherein the module and the modular platform chassis operate in compliance with an industry standard, the industry standard to include Advanced Telecommunications Computing Architecture (ATCA) Base Specification, PCI Industrial Computer Manufacturers Group (PICMG) 3.0, Revision 1.0.

* * * * *

UNITED STATES PATENT AND TRADEMARK OFFICE
CERTIFICATE OF CORRECTION

PATENT NO. : 7,283,921 B2  
APPLICATION NO. : 11/202269  
DATED : October 16, 2007  
INVENTOR(S) : Chandwani et al.

Page 1 of 1

It is certified that error appears in the above-identified patent and that said Letters Patent is hereby corrected as shown below:

In column 12, line 13, in Claim 15, after "responsive" insert -- to --.

Signed and Sealed this

Twenty Second Day of April, 2008

JON W. DUDAS  
*Director of the United States Patent and Trademark Office*